United States Patent [19]
Schwenk et al.

[11] Patent Number: 5,294,748
[45] Date of Patent: Mar. 15, 1994

[54] EQUIPMENT CABINET

[75] Inventors: Hans M. Schwenk, Straubenhardt; Kurt Pohl, München; Gerhard Hüller, Reichersbeuren, all of Fed. Rep. of Germany

[73] Assignee: Schroff GmbH, Straubenhardt, Fed. Rep. of Germany

[21] Appl. No.: 931,474

[22] Filed: Aug. 19, 1992

[30] Foreign Application Priority Data

Aug. 20, 1991 [DE] Fed. Rep. of Germany ....... 4127468

[51] Int. Cl.$^5$ .............................................. H05K 9/00
[52] U.S. Cl. .................................... 174/35 R; 361/816
[58] Field of Search .................... 174/35 R, 35 MS; 361/424; 312/265.1, 265.2, 265.3, 265.4, 296, 128, 129, 130, 140

[56] References Cited

U.S. PATENT DOCUMENTS

| | | |
|---|---|---|
| 3,217,058 | 11/1965 | Lindgren ................. 174/35 |
| 3,253,082 | 5/1966 | Buset ....................... 174/35 |
| 4,300,016 | 11/1981 | Bergeron et al. ........ 174/35 |
| 4,626,615 | 12/1986 | Van Dyk, Jr. ........ 174/35 MS |
| 4,631,641 | 12/1986 | Brombal et al. . | |
| 4,643,319 | 2/1987 | Debus et al. ............ 211/189 |
| 4,760,496 | 7/1988 | Koch . | |
| 4,777,565 | 10/1988 | McIntosh ................ 361/424 |
| 5,020,866 | 6/1991 | McIlwraith ............ 312/265.4 |

FOREIGN PATENT DOCUMENTS

| | | |
|---|---|---|
| 0255587 | 2/1988 | European Pat. Off. . |
| 0306694 | 3/1989 | European Pat. Off. . |
| 0340773 | 11/1989 | European Pat. Off. . |
| 0427550 | 5/1991 | European Pat. Off. . |
| 1884362 | 6/1963 | Fed. Rep. of Germany . |
| 1465247 | 1/1964 | Fed. Rep. of Germany . |
| 2134815 | 1/1972 | Fed. Rep. of Germany . |
| 7442069 | 5/1975 | Fed. Rep. of Germany . |
| 2829255 | 1/1980 | Fed. Rep. of Germany . |
| 3129582 | 2/1983 | Fed. Rep. of Germany . |
| 3611693 | 5/1987 | Fed. Rep. of Germany . |
| 3604860 | 8/1987 | Fed. Rep. of Germany . |
| 8803544 | 8/1988 | Fed. Rep. of Germany . |

OTHER PUBLICATIONS

"F-Geschirmte Schaltschrank-Systeme", Rittal Handbook 26, Jun. 1990, pp. 170-171, 254, 258-259.
HF Brochure from Rittal, (Feb. 1991) pp. 6-7.

Primary Examiner—Leo P. Picard
Assistant Examiner—Bot Ledynh
Attorney, Agent, or Firm—Spencer, Frank & Schneider

[57] ABSTRACT

In an equipment cabinet equipped with a rack for electronic and electrical insertable units, all casing components, including side walls, a rear wall, a door, a top and a bottom, are provided with mating contact faces along the component edges so as to provide a shield against electromagnetic radiation. Contact strips made of an electrically well conducting material are arranged between these contact faces.

10 Claims, 4 Drawing Sheets

EQUIPMENT CABINET

CROSS REFERENCE TO RELATED APPLICATION

This application claims the priority of Application Ser. No. P 41 27 468.7, filed Aug. 20, 1991, in the Federal Republic of Germany, the subject matter of which is incorporated herein by reference.

BACKGROUND OF THE INVENTION

The present invention relates to an equipment cabinet for electronic and electrical insertable units that includes a self-supporting rack for holding the insertable units as well as metal casing components including side walls, a rear wall, a door, a top and a bottom.

Equipment cabinets for accommodating electronic components must meet a number of requirements. For example, these cabinets must have excellent mechanical strength—also with respect to vibratory stresses and during earthquakes. The additionally required good accessibility for the inserted units requires easily removable casing components which not only provide protection against dust and water but also against electromagnetic radiation.

In order to realize optimum high frequency shielding, it has been attempted in the past to use the casing to form the most gap-free, closed, electrically conductive casing around the equipment cabinet. This has been done by producing a plurality of conductive connections between the various casing components and the rack and between the rack components themselves as well as between the individual casing components. These procedures required careful, expensive manual labor in the assembly of the equipment cabinet and particularly a very good, electrically conductive, supporting rack as it can be realized by way of electroplating surface refinement, for example with nickel, or by the use of stainless steel. It is not possible to selectively or subsequently provide an HF shield for racks that were manufactured for simple applications in an inexpensive manner and without consideration of shielding measures.

Another solution of the shielding problem is the insertion of the rack in a box that is closed on all sides, is soldered or welded shut and on which rests a door that is provided with contacts; however, the drawback here is the poor accessibility of the inserted components since access is possible only through the opened door.

An equipment cabinet gasket is known which includes a frame-type rack to which the casing components, namely walls, door, top and bottom are fastened. The frame rack is composed of metal profiles that are provided with outwardly projecting flanges or strips onto which sealing strips are clamped. These sealing strips are made of rubber and, for fastening purposes, are provided with a spring-elastic insert that has a U-shaped profile and is provided with barbs. On its exterior, the sealing strip is covered with a conductive braided metal structure that electrically connects the frame rack with the screwed-on casing components. The metal profiles and the sealing strip are of an expensive design, a gap-free HF shield is hardly realizable (unexamined published European Patent Application EP 0,427,550).

Also known is a switch cabinet including a frame rack that is provided with an all-around casing equipped with a door. A box-shaped insert that is closed on all sides and is pushed into the frame rack serves as the HF shield. A shielding plate is inserted into the interior face of the door. For the purpose of sealing, the edges of the insert as well as those of the shielding plate are provided with plug-in, resilient contact strips which, when the door is in the closed position, are congruent with one another. However, the desired high frequency shield is here obtained at high expense in the form of an insert (German Patent 3,611,693 which corresponds to U.S. Pat. No. 4,760,496).

Sealing strips for sealing and shielding slits and crevices in devices to be shielded where the sealing strips are composed of a cord of braided metal and a vulcanized-on rubber sealing profile are disclosed in Unexamined Published German Patent Application DE 2,829,255.

SUMMARY OF THE INVENTION

It is an object of the present invention to design an equipment cabinet that includes a self-supporting rack for electronic and electrical insertable units, in which the high costs for HF shielding are reduced and which makes it possible to employ the same rack for an unshielded as well as a shielded cabinet.

As a solution to this problem, the invention is based on an equipment cabinet which includes a self-supporting rack to hold the insertable units and metal casing components, including side walls, a rear wall, a door, a top and a bottom. The solution resides in that, for the purpose of providing shielding against electromagnetic radiation, the casing components are provided along their edges with mutually corresponding, electrically well conducting contact faces between which spring-elastic contact strips composed of an electrically well conducting material are disposed.

The proposed configuration of the edge regions of the casing components permits a strict separation between the mechanical structure of an equipment cabinet—that is, its rack—and its high frequency shielding. This means that the rack can be designed without the consideration of shielding measures and thus economically. The same rack is used for shielded and unshielded equipment cabinets. The casing components are only electrically connected with one another; all previously unavoidable electrical connections with the rack are eliminated. The casing components are merely mechanically tacked to the rack, for example by screwing, hanging on or also clamping on, while they are otherwise electrically insulated from it.

According to another advantageous feature of the invention, the casing components are provided with beveled edge strips which support the contact faces. This measure imparts sufficient rigidity to the casing components and facilitates the attachment of the contact faces which can be done in various ways.

In particular, it facilitates the arrangement and sealing of the connecting components serving as doors if the edge strips are attached to peripheral, rectangular bevels on the casing components.

In a very advantageous embodiment of the invention, the edge strips of all casing components are bent inwardly all around the structure at an angle of approximately forty-five degrees. Thus all contact faces have the same configuration and the contact strips can be attached very easily. The edge strips may also be bent inwardly at another, acute, angle as long as these angles supplement one another to 90° at the edges of two adjacent casing components that are to be joined.

The contact strips may be fastened to the contact faces provided on the edge strips. This may be effected, for example, by clamping or gluing them on with a conductive adhesive.

It is also possible to fasten the contact strips to the rack which, if the contact strips are suitably configured, may be effected, for example, by clamping.

Advantageously, the contact strips are composed of rows of spring contacts made of a non-oxidizing metallic material or of rubber-elastic conductive sealing strips. Wherever it appears to be advisable—for example in connection with the sealing of doors—elastic braided metal structures may also serve as contact strips which, if required, have a core of foamed, rubber-elastic plastic.

HF shielding and mechanical seals may also be configured separately in that additional rubber-elastic sealing strips are arranged between the contact faces parallel to the contact strips.

BRIEF DESCRIPTION OF THE DRAWINGS

The present invention will now be described in greater detail with reference to two embodiments thereof that are illustrated in the attached drawings, in which.

DETAILED DESCRIPTION OF THE PREFERRED EMBODIMENTS

Figure 4:
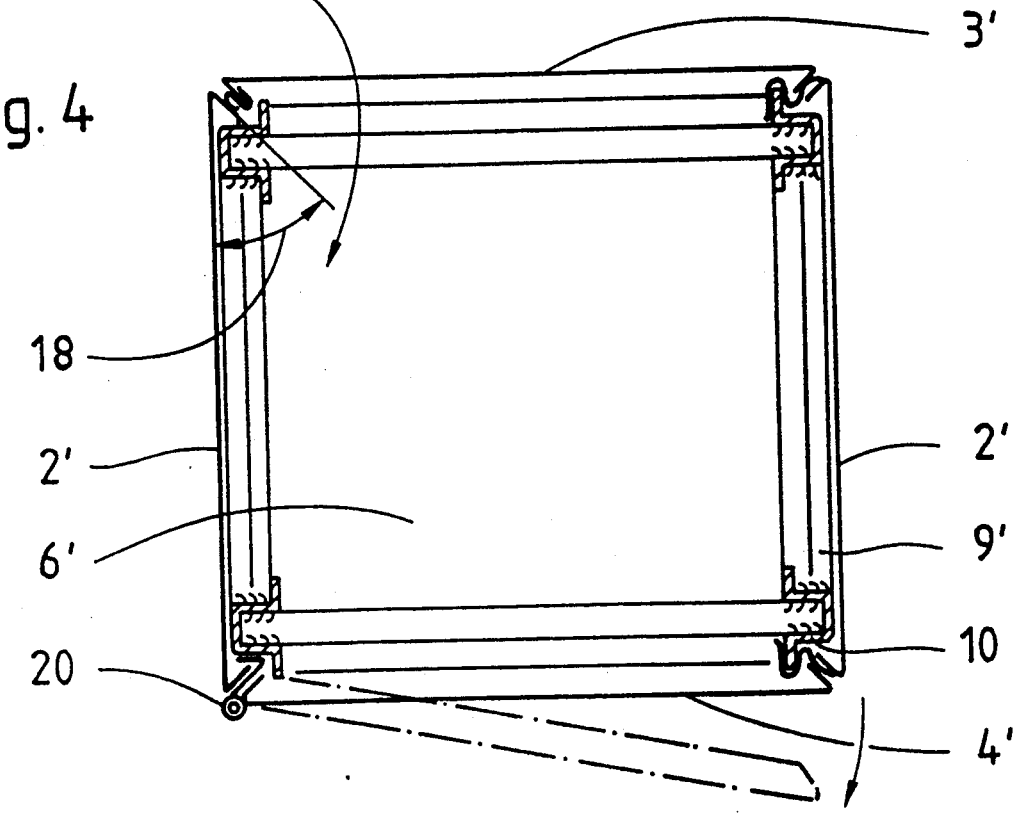
FIG. 4 is a horizontal sectional view of a second equipment cabinet equipped with the casing components of FIG. 2.
Figure 5:
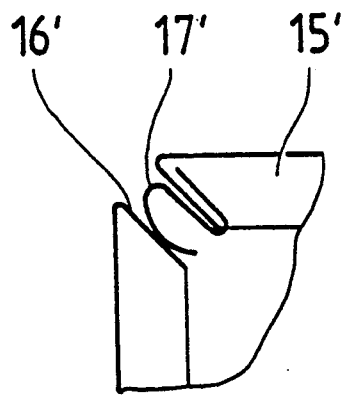
FIG. 5 depicts a first corner configuration of the equipment cabinet shown in FIG. 4.

As depicted in the drawings, the equipment cabinet for accommodating electronic and electrical insertable units is essentially composed of a self-supporting, block-shaped rack 1 or 1', respectively (FIGS. 3 to 5) for holding the insertable units and of a plurality of metal casing components, namely (FIGS. 1 and 2) side walls 2 and 2', a rear wall 3 or 3', respectively, a door 4 or 4', respectively, a top 5 or 5', respectively, and a bottom 6 or 6', respectively. These casing components are made of sheet steel and their surfaces are appropriately protected against corrosion on their exterior and interior faces by one or several coats of lacquer 7.

Rack 1 (FIG. 3) which is assembled by welding of steel pipes having a square cross section is composed of four vertical posts 8 and eight horizontal traverse members 9; it is equipped with rails, telescopes, supports, and struts (all not shown) for fastening the insertable units (not illustrated). The rack 1' shown in FIG. 4 is assembled with the aid of profiled steel rods 10 that have an essentially U-shaped cross section and is equipped in a corresponding manner. As a protection against external influences, racks 1 and 1' are also provided with electrically non-conductive coatings 11 produced, for example, by spray lacquering or dipping.

Figure 1:
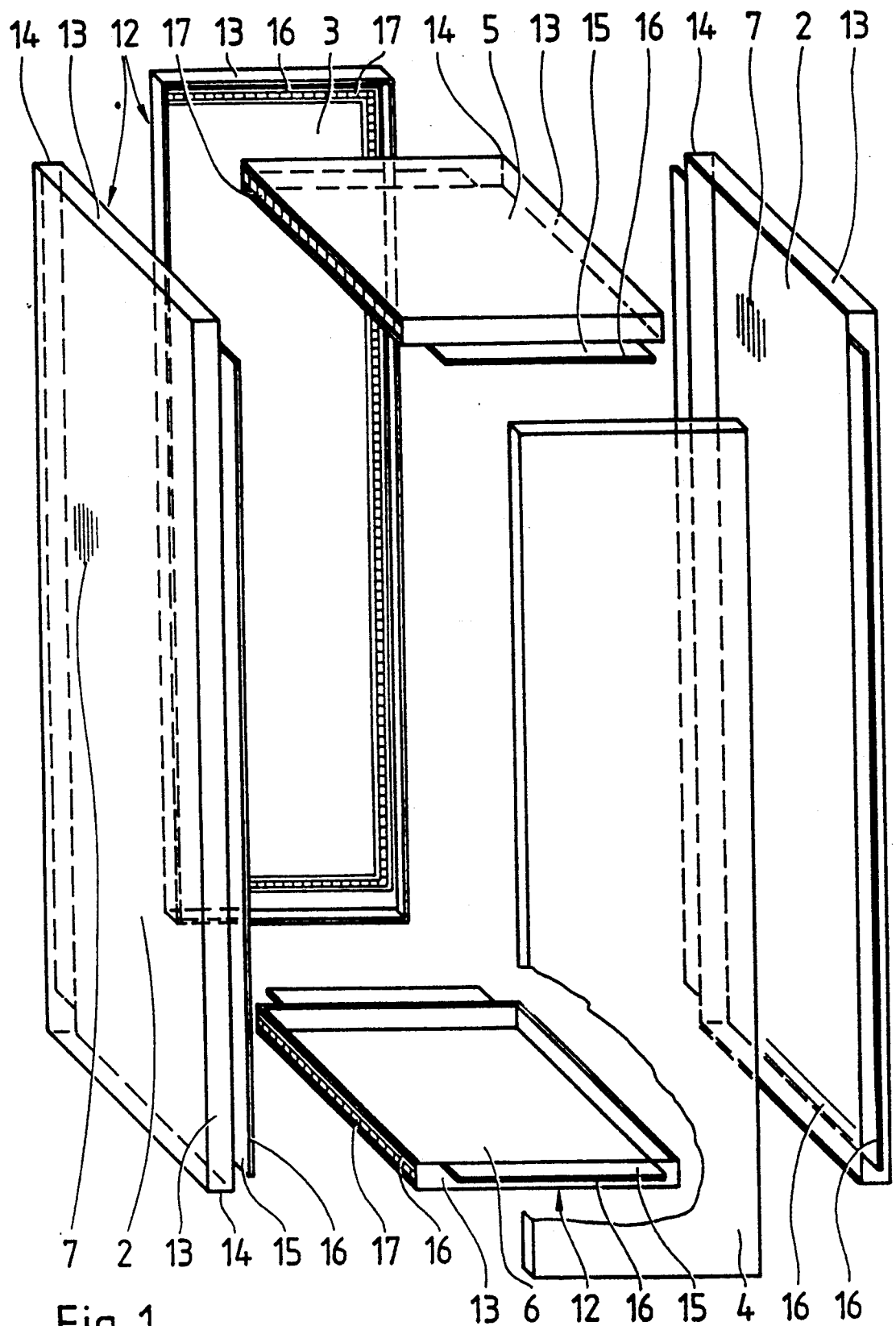
FIG. 1 is an exploded view of a first embodiment of the casing components of an equipment cabinet, where the components are provided with peripheral, rectangular bevels.

The casing components shown in FIG. 1, the two identical side walls 2, the rear wall 3, the door 4, the top 5 and the bottom 6, the latter identical to the top, are configured as very low rectangular troughs. At all of their edges 12, they are provided with peripheral, rectangular bevels 13 of the same height which abut at the four corners 14 and are there connected with one another. For the two side walls 2 and top 5 as well as bottom 6, beveled edge strips 15 of the same width are attached to these bevels 13 so as to project outwardly at a right angle and extend in each case only to the vicinity of corners 14 so that top 5 and bottom 6 can be pushed into side wall 2.

Along their edges 12, all casing components 2, 3, 4, 5 and 6 are provided with electrically well conducting contact faces 16. When the shielding is assembled and casing components 3, 4, 5 and 6 abut at one another for that purpose, these contact faces 16 are arranged to face one another.

On the edge strips 15 of sides 2, top 5 and bottom 6, the mutually corresponding bare metal contact faces 16 are formed by their unlacquered abutting edges. Corresponding, but broader, contact faces 16 are also provided on the interior faces of side members 2 along their edges 12 (as indicated in FIG. 1) as well as at the side bevels 13 of top 5 and bottom 6.

Figure 3:
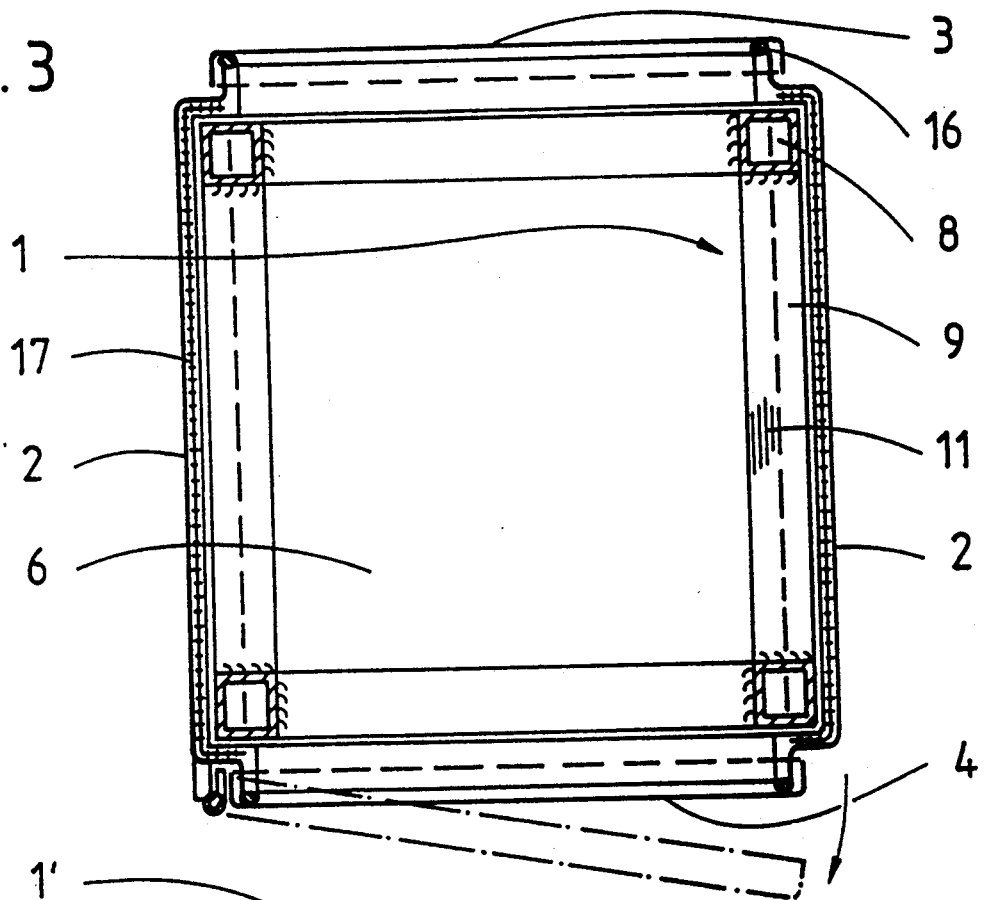
FIG. 3 is a horizontal sectional view of an equipment cabinet equipped with the casing components of FIG. 1.

Spring-elastic contact strips 17 are arranged between the conductive contact faces 16 of facing casing components 2, 3, 4, 5 and 6 (see FIG. 3). These contact strips 17, which are made of a well conducting material, are elastic braided metal structures in the form of flexible cords or rows or strips of spring contacts of a suitable high quality, corrosion protected metal. These contact strips 17 are each electrically conductively fastened in a suitable manner on the contact faces 16 of the edge strips 15 of one of the two juxtaposed casing components 2, 3, 4, 5 and 6 where they form a gap that must be sealed against electromagnetic radiation.

Figure 2:
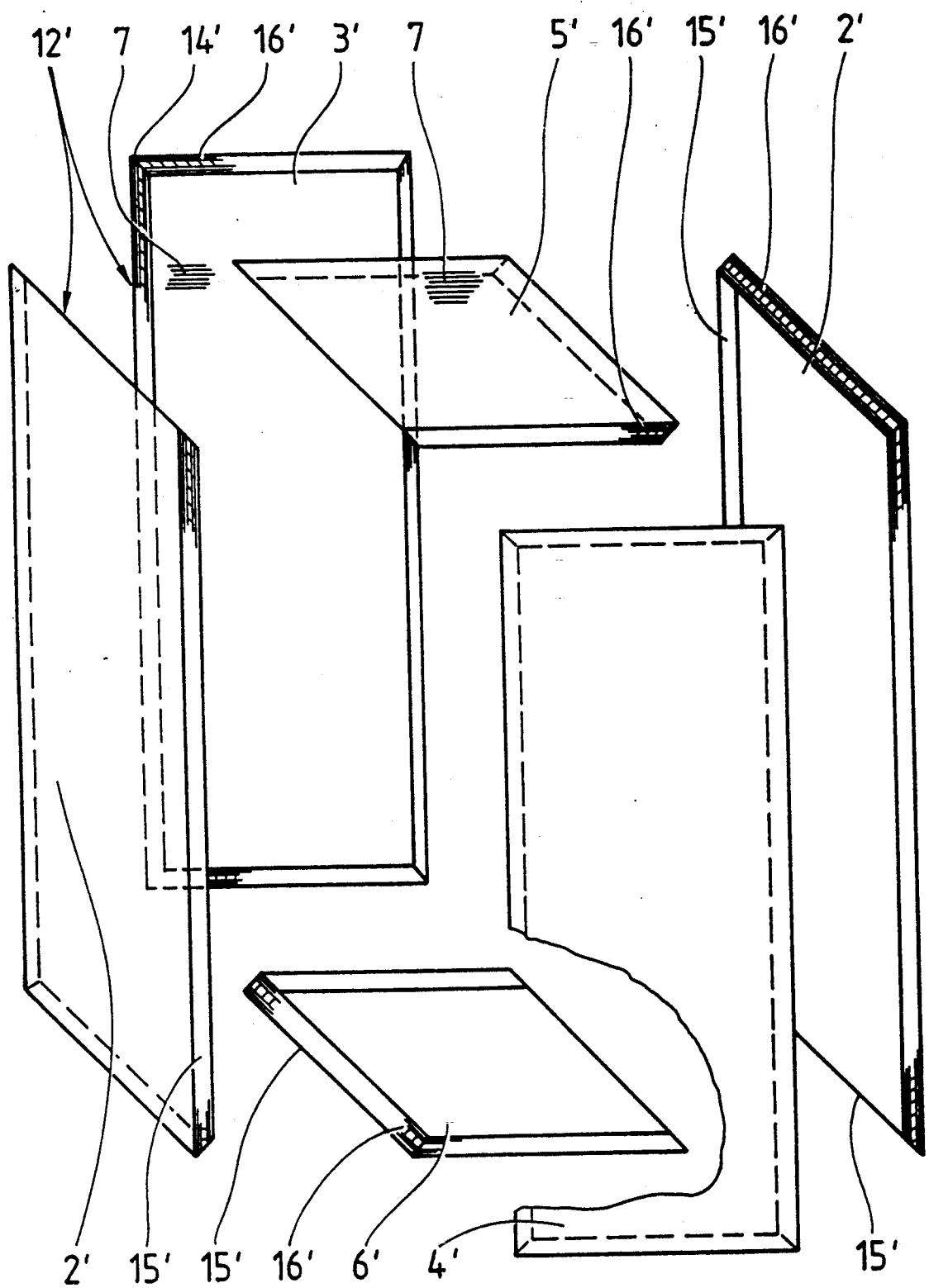
FIG. 2 is likewise an exploded view of a second embodiment of the casing components of an equipment cabinet, where the components are provided with inwardly bent, peripheral edge strips.

In the alternative embodiment shown in FIG. 2, the assemblable casing components are also given a trough-shaped configuration, with the two side walls 2', the rear wall 3', the door 4', the top 5' and the bottom 6' being provided with peripheral edge strips 15' which are bent inwardly at an angle 18 of forty-five angular degrees (FIG. 4) so as to form a high-frequency-tight shield that is closed on all sides around rack 1'. These edge strips 15' as well are connected with one another (for example, by welding) at the corners 14' of casing components 2', 3', 4', 5' and 6'.

Along all of their edges 12', casing components 2' to 6' are provided with peripheral, bare metal and thus electrically well conducting contact faces 16' which are arranged in opposing pairs and thus correspond with one another. Contact strips 17' of a spring-elastic, electrically well conducting material are disposed between the strip-shaped contact faces 16'. Such contact strips 17' (see FIG. 2) support the edge strips 15' of both side walls 2', rear wall 3' and door 4', while top 5' and bottom 6' are provided only with contact faces 16'. The assembled casing components 2' to 6' form a completely closed shield in the form of a block-shaped box which surrounds rack 1 and which excellently shields the inserted units held therein against extraneous electromagnetic waves in the sense of a Faraday cage and almost completely attenuates the escape of such waves that are generated within the insertable units themselves, as long as all existing gaps between casing components 2' to 6' are completely and thoroughly sealed by means of contact strips 17'.

Figure 6:
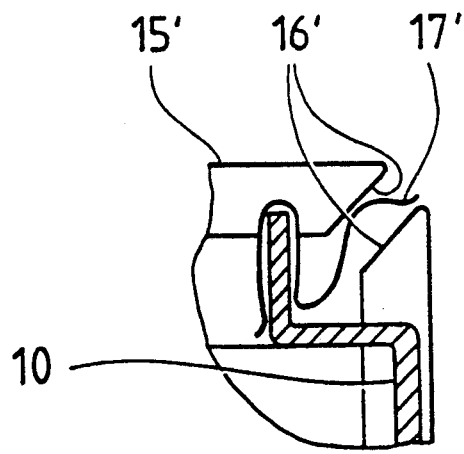
FIG. 6 depicts a second corner configuration of the equipment cabinet shown in FIG. 4.

If contact strips 17' are configured appropriately—have an approximately S-shaped cross section—they may be fastened (see FIG. 5) by clamping them to edge strips 15'. Differently configured contact strips 17' can be fastened in a different manner in that they are fastened to rack 1 by clamping (see FIG. 6).

Figure 7:
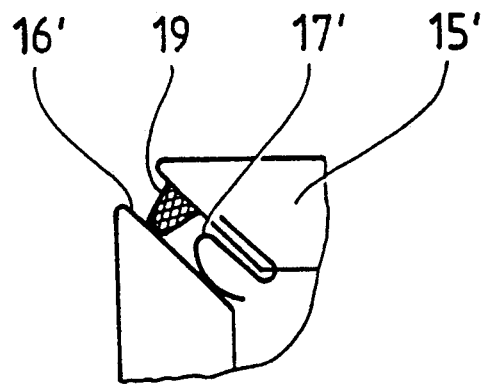
FIG. 7 depicts a third alternative for the configuration of the corner of the equipment cabinet of FIG. 4.

FIG. 7 shows a further embodiment in which additional rubber-elastic sealing strips 19 are arranged parallel to the metal contact strips 17' so as to provide a good mechanical seal.

The independent shielding composed of the assembled casing components 2, 2' to 6, 6' is fastened to rack 1, 1' in any desired manner, for example by screwing or clamping. Since this can be accomplished very easily, the equipment cabinets can be selectively or even subsequently provided with one of the two described shielding arrangements. It is understood that simple additional measures are required to shield, for example, the plates of hinges 20 for doors 4, 4' which are brought out through the casing and which—since they require efforts that are commonplace in the trade—need not be described here.

It will be understood that the above description of the present invention is susceptible to various modifications, changes and adaptations, and the same are intended to be comprehended within the meaning and range of equivalents of the appended claims.

What is claimed is:

1. An equipment cabinet for electronic and electrical insertable units, the cabinet including a self-supporting rack for holding the insertable units, and metal casing components, including side walls, a rear wall, a door, a top and a bottom mounted on said rack; and wherein, for the purpose of providing a shield against electromagnetic radiation, said casing components are provided along their edges with electrically well conducting contact faces which matingly engage facing ones of said edges of adjacent ones of said casing components, and spring-elastic contact strips, that are composed of an electrically well conducting material, are disposed between matingly engaged ones of said contact faces.

2. An equipment cabinet according to claim 1, wherein said casing components are provided with beveled edge strips which support the contact faces.

3. An equipment cabinet according to claim 2, wherein said edge strips are attached to peripheral, rectangular bevels on the casing components.

4. An equipment cabinet according to claim 2, wherein, all around the cabinet, the edge strips are bent inwardly at an angle of approximately forty-five degrees.

5. An equipment cabinet according to claim 2, wherein said contact strips are fastened to contact faces that are provided at the edge strips.

6. An equipment cabinet according to claim 1, wherein said contact strips are fastened to the rack.

7. An equipment cabinet according to claim 1, wherein said contact strips are composed of rows of spring contacts.

8. An equipment cabinet according to claim 1, wherein elastic braided metal structures serve as said contact strips.

9. An equipment cabinet according to claim 4, wherein additional rubber-elastic sealing strips are arranged matingly engaging contact faces parallel to the contact strips.

10. An equipment cabinet according to claim 1, wherein said casing components surround and enclose said rack.

* * * * *